(12) United States Patent
Huber

(10) Patent No.: US 6,731,150 B2
(45) Date of Patent: May 4, 2004

(54) AMPLIFIERS WITH VARIABLE SWING CONTROL

(75) Inventor: Brian W. Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/233,147

(22) Filed: Aug. 28, 2002

(65) Prior Publication Data

US 2004/0041612 A1 Mar. 4, 2004

(51) Int. Cl.[7] ................................................ H03K 5/08
(52) U.S. Cl. ...................... 327/323; 327/312; 327/316; 330/260
(58) Field of Search ............................... 327/306, 309, 327/312, 316, 318, 321–324, 363, 560–563; 365/189.06; 330/260, 278, 291, 292

(56) References Cited

U.S. PATENT DOCUMENTS

| 3,641,450 | A |   | 2/1972  | Lunn ......................... 330/30 D |
|-----------|---|---|---------|----------------------------------------|
| 4,517,525 | A |   | 5/1985  | Dijkmans et al. ............. 330/260  |
| 4,769,616 | A |   | 9/1988  | Barbu .......................... 330/252 |
| 4,977,378 | A |   | 12/1990 | Tero ............................ 330/258 |
| 5,361,040 | A |   | 11/1994 | Barrett, Jr. ................... 330/253 |
| 5,619,169 | A |   | 4/1997  | Matsuura ..................... 330/254  |
| 5,783,953 | A | * | 7/1998  | Bosnyak et al. ............. 327/101   |
| 5,793,551 | A |   | 8/1998  | Ngo et al. ...................... 360/67 |
| 6,028,466 | A | * | 2/2000  | Hartley ........................ 327/328 |
| 6,064,613 | A | * | 5/2000  | Wang ........................... 365/207 |
| 6,377,120 | B1| * | 4/2002  | Hsieh .......................... 330/253 |
| 6,456,144 | B2|   | 9/2002  | Catala .......................... 327/359 |
| 6,472,908 | B1|   | 10/2002 | Smetana ....................... 327/52  |
| 6,504,435 | B1| * | 1/2003  | Martins ........................ 330/292 |

OTHER PUBLICATIONS

Allen, P., et al., *CMOS Analog Circuit Design, 2nd Edition*, (2002),pp. 390–393.

* cited by examiner

*Primary Examiner*—Minh Nguyen
(74) *Attorney, Agent, or Firm*—Schwegman, Lundberg, Woessner & Kluth, P.A.

(57) ABSTRACT

An amplifying circuit includes an amplifying stage for receiving input signals to generate output signals. A swing detect unit detects signal levels of the output signals. A clamp unit variably limits signal levels of the input signals based on the signal levels of the output signals detected by the swing detect unit to improve the speed of the amplifying circuit.

41 Claims, 13 Drawing Sheets

AMPLIFIERS WITH VARIABLE SWING CONTROL

TECHNICAL FIELD

The present invention relates generally to electronic circuits, and in particular to amplifiers with input and output signals control.

BACKGROUND

Many electrical circuits have amplifiers for amplifying input signals to produce amplified output signals.

In most applications, the signal levels of the output signals depend on the signal levels of the input signals. And the speed of the amplifier depends on the switching of the output signals. Thus, the speed of the amplifier indirectly depends on the signal levels of the input signals.

In some applications, the input signals of the amplifier are limited to some fixed signal levels to improve the speed of the amplifier. However, in some cases, fixing the signal levels of the input signals may cause the output signals to differ from specified signal levels.

SUMMARY OF THE INVENTION

The various embodiments of the present invention provide methods and circuits for variably limiting signal levels of input signals of amplifiers based on signal levels of output signals of the amplifiers to improve the speed of the amplifying circuit.

In one aspect, a circuit includes an amplifying stage for receiving input signals to generate output signals. A swing detect unit detects signal levels of the output signals. A clamp unit variably limits signal levels of the input signals based on the detection by the swing detect unit.

In another aspect, a method of operating an amplifying circuit includes receiving input signals to generate output signals. The method further includes limiting signal levels of the input signals based on signal levels of the output signals.

DETAILED DESCRIPTION OF THE INVENTION

Figure 1:
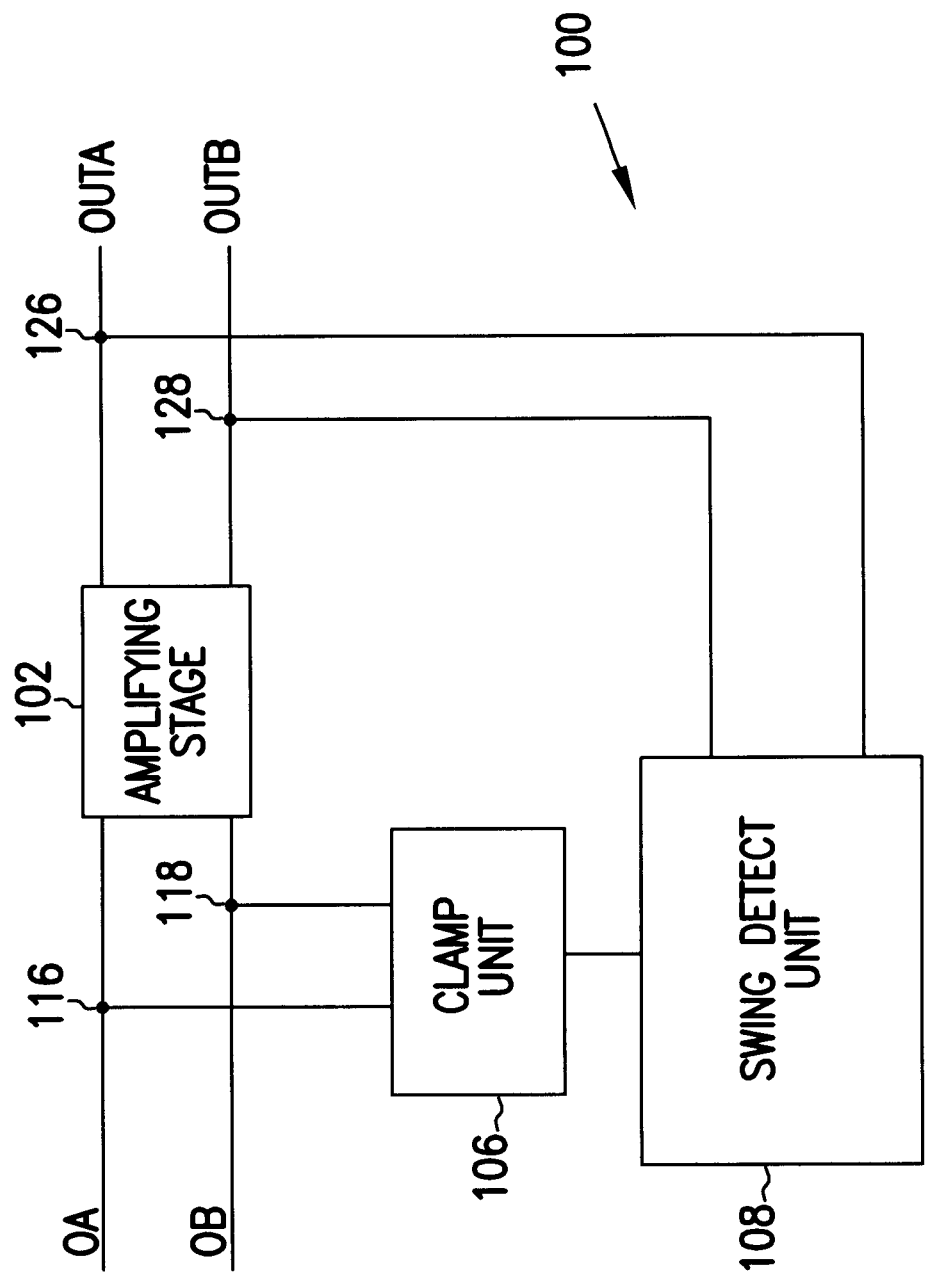
FIG. 1 shows an amplifying circuit according to an embodiment of the invention.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows an amplifying circuit according to an embodiment of the invention. Circuit 100 includes an amplifying stage 102, a clamp unit 106, and a swing detect unit 108. Amplifying stage 102 receives input signals OA and OB at a pair of input nodes 116 and 118 and generates output signals OUTA and OUTB at a pair of output nodes 126 and 128. In some embodiments, the OA and OB signals are differential signals and the OUTA and OUTB signals are differential signals. Amplifying stage 102 may include more than one amplifying step as well as various compensations including those to ensure overall stability.

In embodiments represented by FIG. 1, the OA and OB signals have unequal signal levels. When the signal level of one signal is low, the signal level of the other signal is high. The OUTA and OUTB signals also have unequal signal levels. In some embodiments, the OA and OUTB signals have different polarities and the OB and OUTA signals have different polarities. When the signal level of the OA signal is low, the signal level of the OUTB signal is high and when the signal level of the OA signal is high the signal level of the OUTB signal is low. Similarly, when the signal level of the OB signal is low, the signal level of the OUTA signal is high and when the signal level of the OB signal is high the signal level of the OUTA signal is low.

Figure 2A:
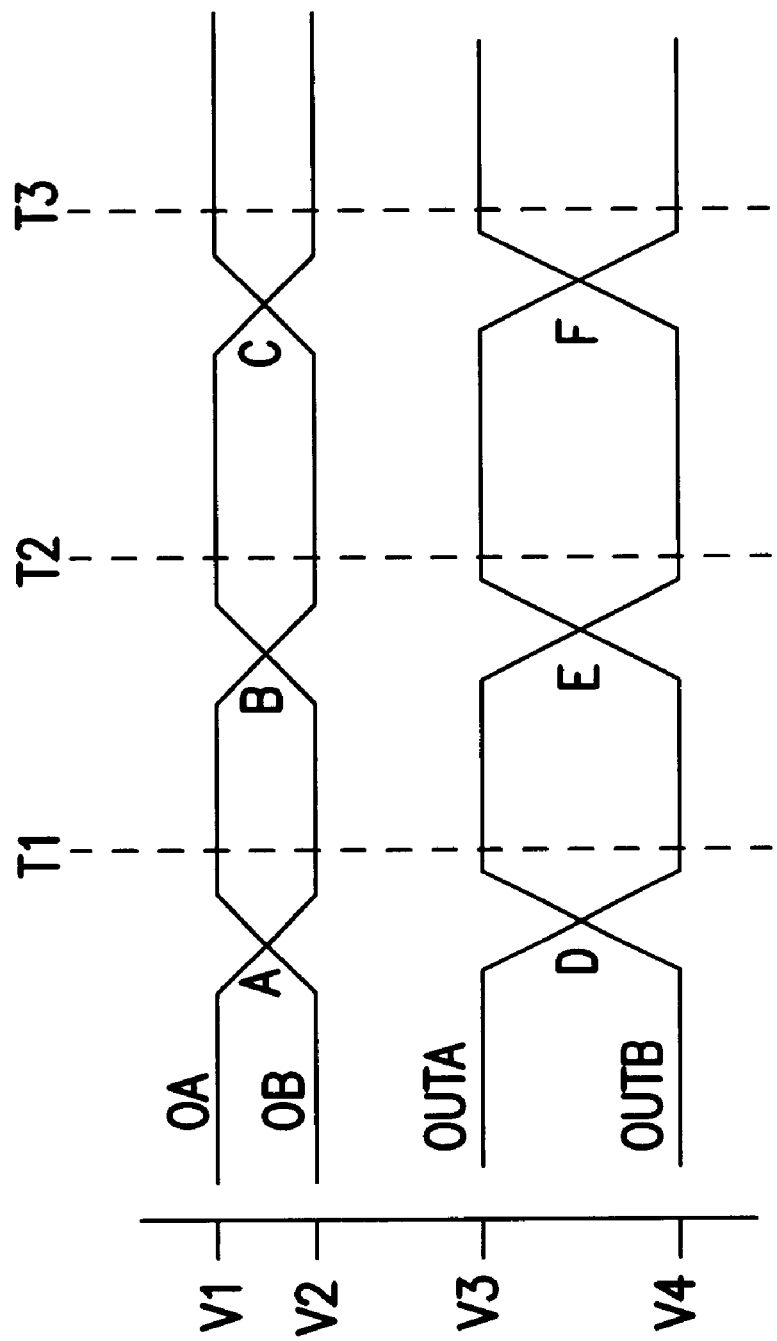
FIG. 2A shows a general timing diagram for FIG. 1.

FIG. 2A is a general timing diagram for FIG. 1. The OA and OB signals swing between signal levels V1 and V2. The OUTA and OUTB signals swing between signal levels V3 and V4. The OUTA and OUTB signals reach a full swing when they are at V3 and V4 levels. The range of signal levels of the OUTA and OUTB signals is about V3 to V4 with V4 being the lowest signal level and V3 being the highest signal level of the range.

The OA and OB signals cross at cross points A, B, and C and they switch from one signal level to another. Every time the OA and OB cross, the OUTA and OUTB signals also cross in response. For example, the OUTA and OUTB signals cross at cross point D, E, and F in response to the OA and OB signals crossing at cross points A, B, and C. After each cross point, the OUTA and OUTB signals reach a full swing signal level. For example, the OUTA and OUTB signals reach a full swing signal level at times T1, T2, and T3.

Swing detect unit 108 detects the swing (signal level) of the OUTA and OUTB signals. When the OUTA and OUTB signals reach a full swing, swing detect unit 108 enables clamp unit 106 to limit (or clamp) the swing (signal levels) of OA and OB signals to speed up the next cross point. For example, when swing detect unit 108 detects the full swing of the OUTA and OUTB signals at time T1, clamp unit 106 limits the swing of the OA and OB signals after time T1 to speed up the next cross point B Since the OUTA and OUTB signals cross in response to the crossing of the OA and OB signals, the next cross point of the OUTA and OUTB signals is also sped up. As a result, the overall speed of circuit 100 increases.

Figure 2B:
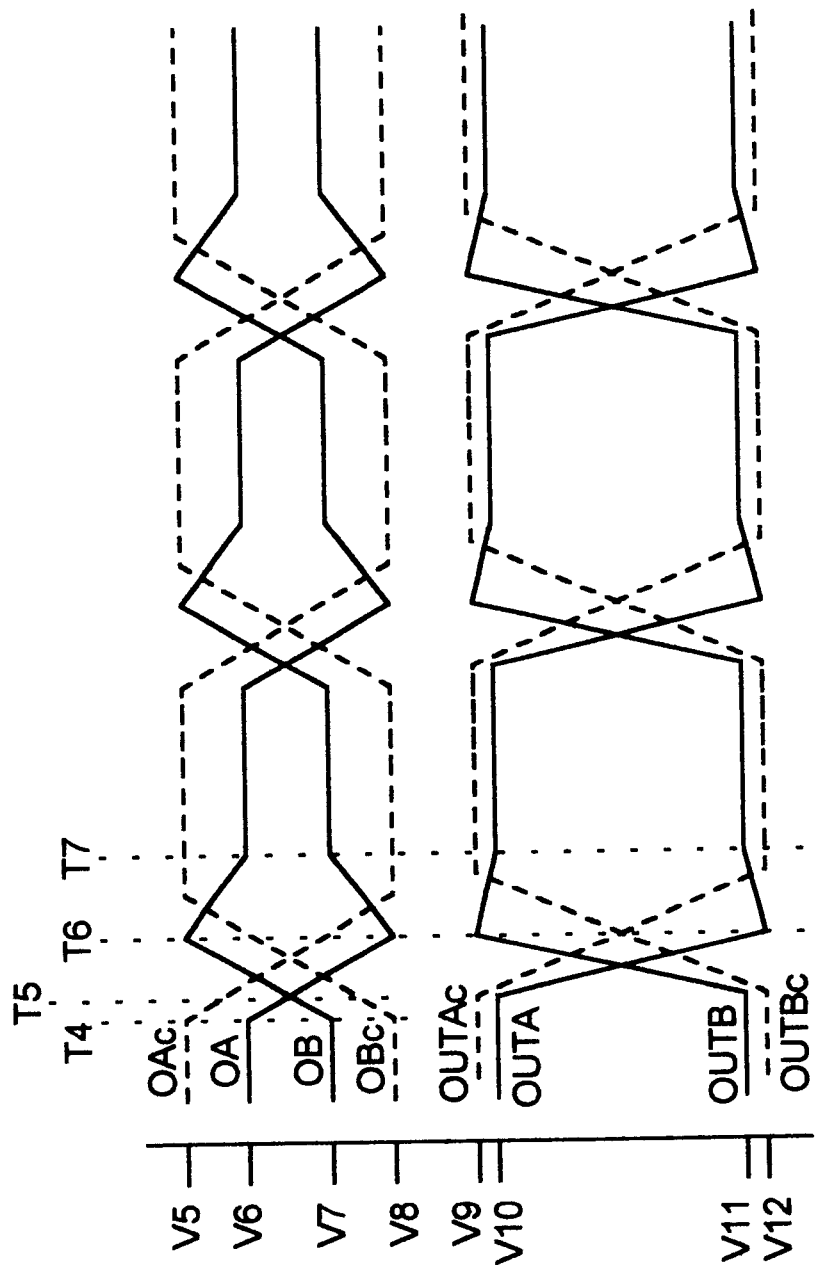
FIG. 2B shows a timing diagram for an embodiment of FIG. 1 and includes signals for a conventional amplifying circuit.

FIG. 2B is a timing diagram with example voltage signals OA, OB, OUTA, and OUTB for an embodiment of FIG. 1. Similar voltage signals OAc, OBc, OUTAc, and OUTBc are shown for a conventional amplifying circuit. When the OUTA and OUTB signals reach near full swing, swing detect unit 108 enables clamp unit 106 to limit the swing (voltage levels) of OA and OB. The limiting speeds up the next cross point for OA and OB signals such that T5 occurs earlier. And in the region of T5 signals OUTA and OUTB reduce from full swing voltage levels (V10 and V11) and correspondingly, swing detect unit 108 senses this, clamp unit 106 reduces or stops limiting the swing of the OA and OB signals. As time T6 is approached, full swing is again sensed by swing detect unit 108 and enables clamp unit 106 once again. There are inherent lag times involved, which allow OA and OB to overshoot to voltage levels V5 and V8 which further insure good slew rates for the OUTA and OUTB signals as well as induce some voltage overshoot to voltage levels V9 and V12. Limiting of OA and OB becomes in full effect near time T7 and the OUTA and OUTB signals reach steady state voltage levels V10 and V11. And correspondingly OA and OB reach steady state voltage levels V6 and V7 for the given operating conditions. Conventional signals OAc, OBc, OUTAc, and OUTBc may be at different relative voltage levels than shown. These conventional signals are shown to give a sense of the speed up effect experienced with an embodiment of FIG. 1.

In embodiments represented by FIG. 1, the limit that clamp unit 106 applies to the signal levels of the OA and OB signals is variable. In some of these embodiments, the swing of the OUTA and OUTB signals varies based on changes in operating voltage condition, while other operating conditions, such as process and temperature, have little effect on the swing of OUTA and OUTB signals. Yet in other of these embodiments, the swing of the OUTA and OUTB signals has very little dependence on any operating conditions such as process, temperature, and voltage. Since clamp unit 106 limits the signal levels of the OA and OB signals based on the swing of the OUTA and OUTB signals, when the swing of the OUTA and OUTB signals varies, the limit applied to the signal levels of the OA and OB signals varies accordingly. Another aspect is that amplifying stage 102 may have significant open loop gain characteristic variability based on operating conditions such as process, temperature, and voltage, while clamp unit 106 limits based on the output swing of the OUTA and OUTB signals. So if the operating conditions result in a low open loop gain characteristic of amplifying stage 102, clamp unit 106 limits less such that the intended swing of the OUTA and OUTB signals are still achieved. Conversely, if the operating conditions result in a high open loop gain characteristic of amplifying stage 102, clamp unit 106 limits more such that the intended swing of the OUTA and OUTB signals are still achieved.

In descriptions of various embodiments of the invention, transistor states are referred to as off or on. As well known in the art, there are varied degrees of both off or on states or varied degrees of resistance between the source and drain of a transistor that are dependent on all nodes voltages of the transistor, with the gate having strong control. The on and off state references are for understanding of the general transistor state, but may involve varied degrees of off or on in each case during actual operation.

Further, various bias units are discussed. Biasing techniques are well known in the art and vary from simple to complex circuitry. Some of these biasing units may be shared to reduce total biasing units for biasing conditions that are intended to be similar.

Figure 3:
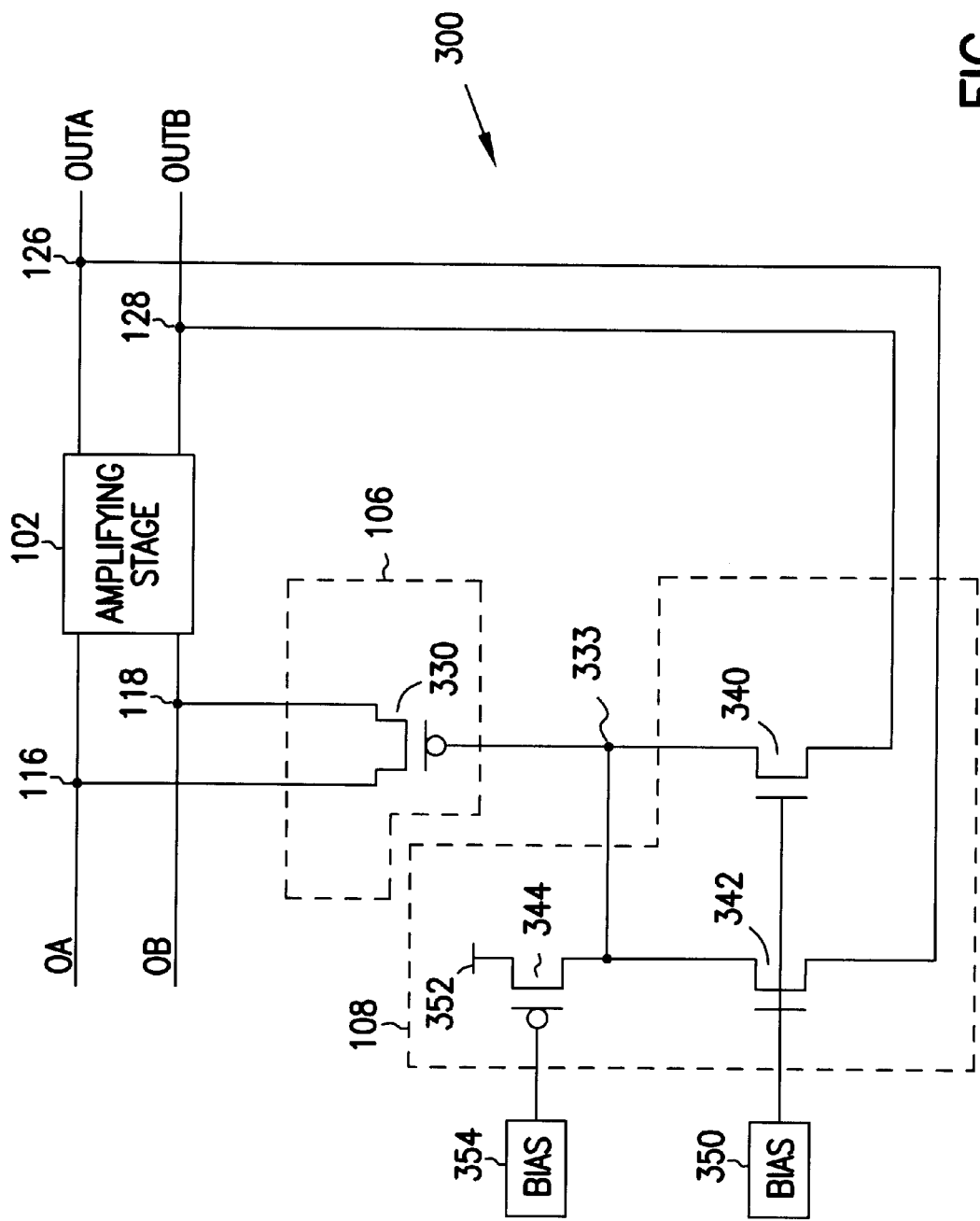
FIGS. 3–9 show various amplifying circuits according to other embodiments of the invention.

FIG. 3 shows an amplifying circuit according to another embodiment of the invention. In circuit 300, clamp unit 106 includes a transistor 330. Transistor 330 forms a switch connected between nodes 116 and 118. Swing detect unit 108 includes transistors 340, 342, and 344. Transistor 344 forms a pullup device. Transistors 340 and 342 form a switching network. When the OUTA and OUTB signals have a full swing (first set of signal levels), either transistor 340 or transistor 342 turns on and dominates transistor 344, pulling the voltage level of node 333 low. This turns on transistor 330 to clamp the OA and OB signals. When the OUTA and OUTB signals do not have a full swing (second set of signal level), both transistors 340 and 342 turn off. Transistor 344 pulls the voltage level of node 333 high (the voltage level of node 352). This turns off transistor 330 and the OA and OB signals are free from the clamp.

Transistor 330 has a source connected to node 116, a drain connected to node 118, and a gate connected to a clamp node 333. Transistors 340 and 342 have their drains connected to node 333, and their gates connected to a bias unit 350. Transistor 340 has a source connected to node 128. Transistor 342 has a source connected to node 126. Transistor 344 has a source connected to a supply node 352, a drain connected to node 333, and a gate connected to bias unit 354.

Transistors 340 and 342 turn on and off based on the voltage levels of bias unit 350 and the signal levels of the OUTA and OUTB signals at node 126 and 128. Bias unit 350 controls transistors 340 and 342 such that one of them turns on when one of the voltage levels at node 126 and 128 is near zero, which is when the OUTA and OUTB signals have a full swing. For example, bias unit 350 applies to the gates of transistors 340 and 342 a voltage that is a fraction above the threshold voltage of transistors 340 and 342. When the voltage level of the source transistor 340 (node 128) gets near zero, transistor 340 turns on. Similarly, when the voltage level of the source of transistor 342 (node 126) gets near zero, transistor 342 turns on. Transistors 340 and 342 turn off when each of the voltage levels of node 126 and 128 is higher than the difference between the voltage applied by bias unit 350 and the threshold voltage of transistors 340 and 342.

Bias unit 354 applies an appropriate voltage such that transistor 344 pulls node 333 to the voltage level of node 352 when both transistors 340 and 342 turn off. In some embodiments, the voltage level of node 352 equals the supply voltage (high) of circuit 300. Thus, when node 333 has a high voltage level, transistor 330 turns off, releasing nodes 116 and 118 from the clamp.

Since nodes 116 and 118 connect to the drain and source of transistor 330, when transistor 330 turns on, nodes 116 and 118 are somewhat shorted. Nodes 116 and 118 are not physically shorted when transistor 330 turns on. However, the resistance between the source and drain of transistor 330 can be substantially small such that nodes 116 and 118 or the signal levels of the OA and OB signals are pulled closer, thereby reducing the difference between their signal levels. Thus, the next cross of the OA and OB signals will occur quicker. Consequently, the next cross of the OUTA and OUTB signals will also occur quicker. Hence, the overall speed of circuit 300 increases.

Figure 4:
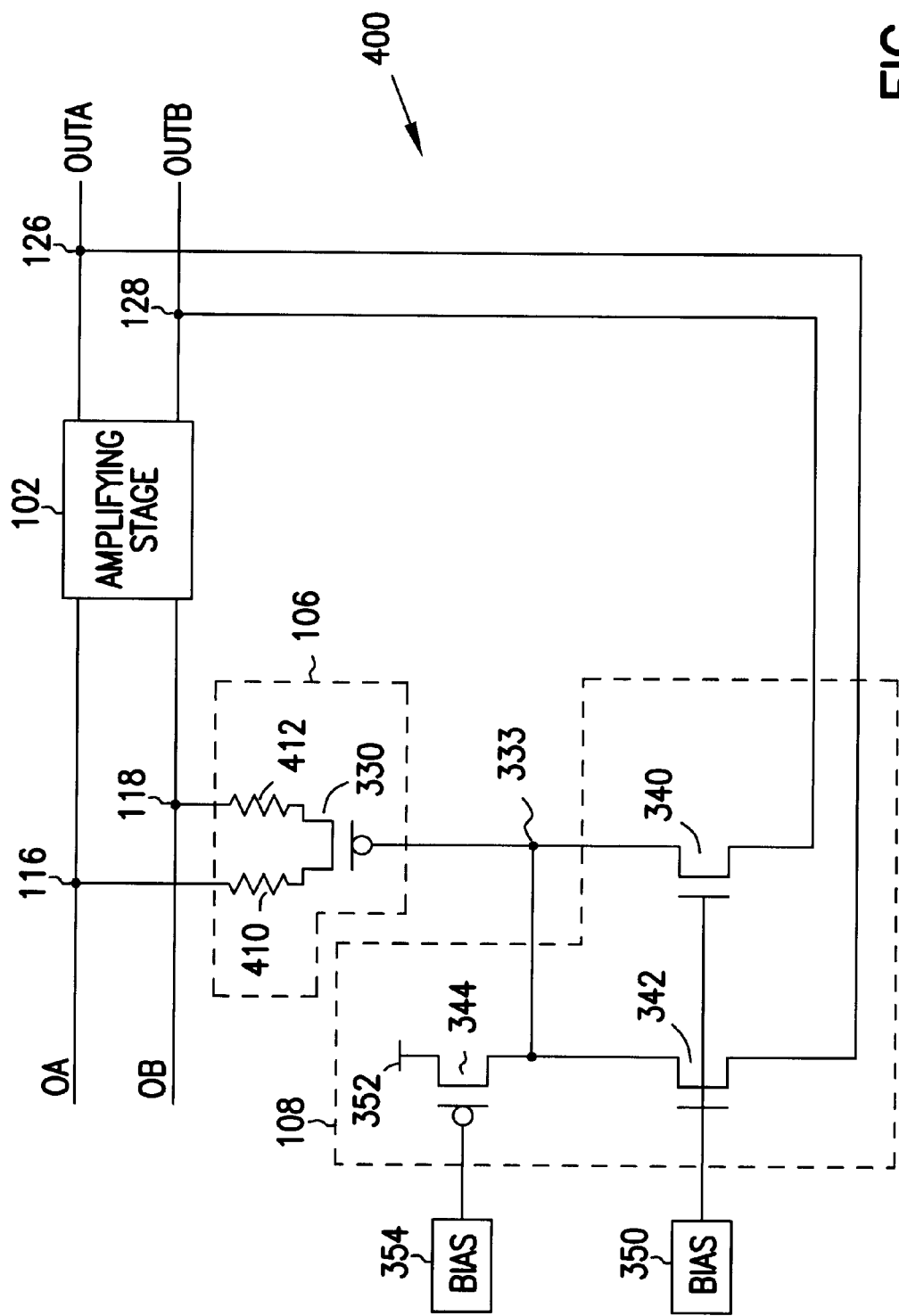

FIG. 4 shows an amplifying circuit 400 according to another embodiment of the invention. Circuit 400 is the same as circuit 300 except for the addition of resistors 410 and 412 in clamp unit 106 of FIG. 4. Resistor 410 connects between a drain of transistor 330 and node 116. Resistor 412 connects between a source of transistor 330 and node 118. The operation of circuit 400 is similar to the operation of circuit 300. Resistors 410 and 412 prevent over-clamping at nodes 116 and 118 and can improve overall stability or phase margin. Another possible benefit is related to the low capacitive nature of resistor 410 and 412 available in some processes and specific resistor type. With resistor 410 and 412 having less capacitance than that associated with the source or drain of transistor 330, the effective capacitive loading seen at OA and OB is reduced, since resistors 410 and 412 provide some isolation.

Figure 5:
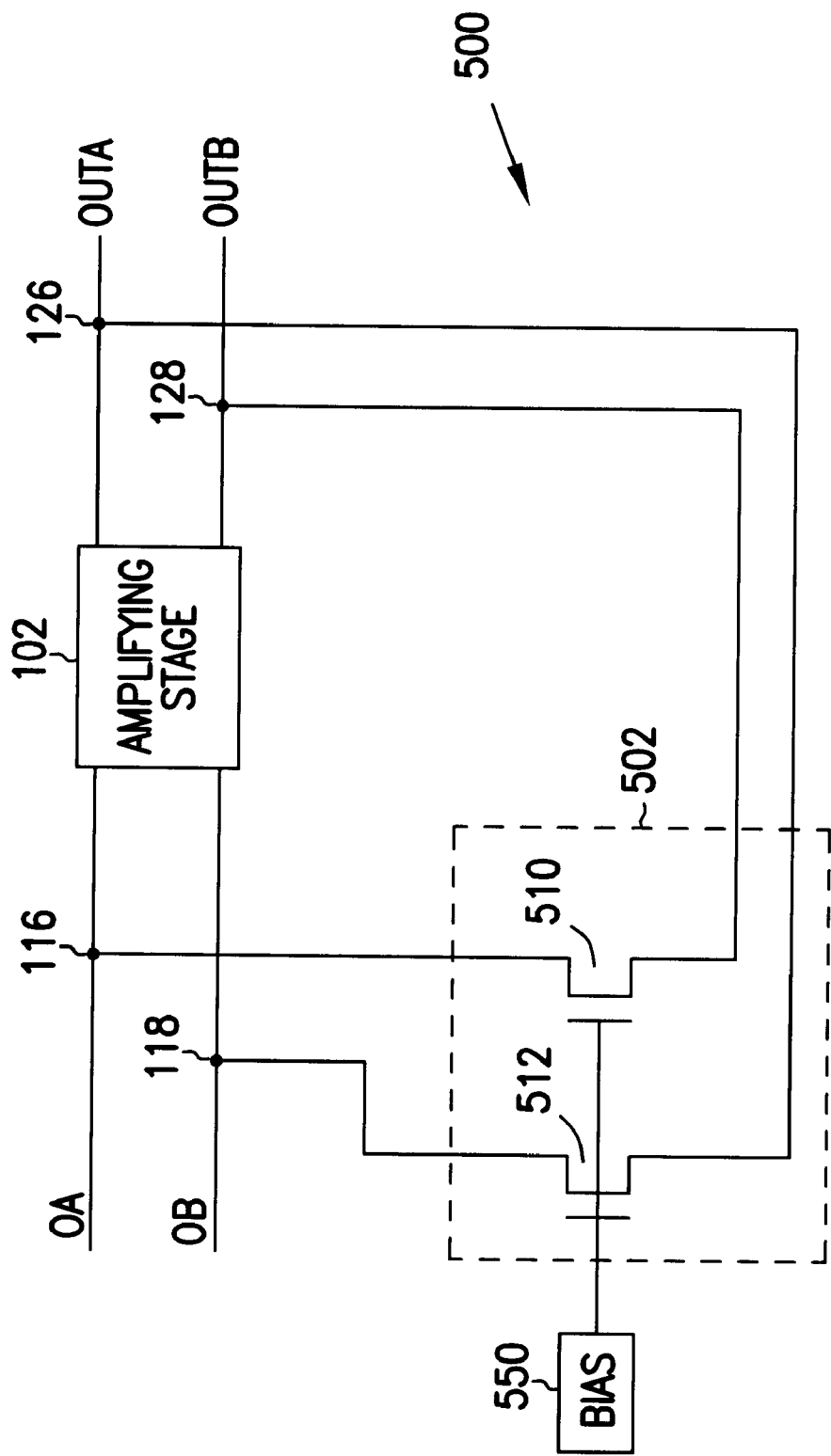

FIG. 5 shows an amplifying circuit according to another embodiment of the invention. Circuit 500 includes a swing detect and clamp unit 502 having transistors 510 and 512. These transistors form a switching network. Swing detect and clamp unit 502 detects the signal levels of nodes 126 and 128 and clamps the signal levels of nodes 116 and 118. Transistor 510 connects between nodes 116 and 128. Transistor 512 connects between nodes 118 and 126. The gates of both transistors 510 and 512 connect to a bias unit 550.

Bias unit 550 applies a bias voltage such that either transistor 510 or 512 turns on when the OUTA and OUTB signals have a full swing, which is when one of the OUTA and OUTB signals is low (when the voltage level of one of the nodes 126 and 128 is near zero). When transistor 510 or 512 turns on, it pulls the voltage level of node 116 or 118 lower. This reduces the difference between the signal levels of the OA and OB signals, thereby increasing the speed of the next cross of the OA and OB signals. Consequently, the speed of the next cross of the OUTA and OUTB signals also increases, leading to an increase in the speed of circuit 500.

Figure 6:
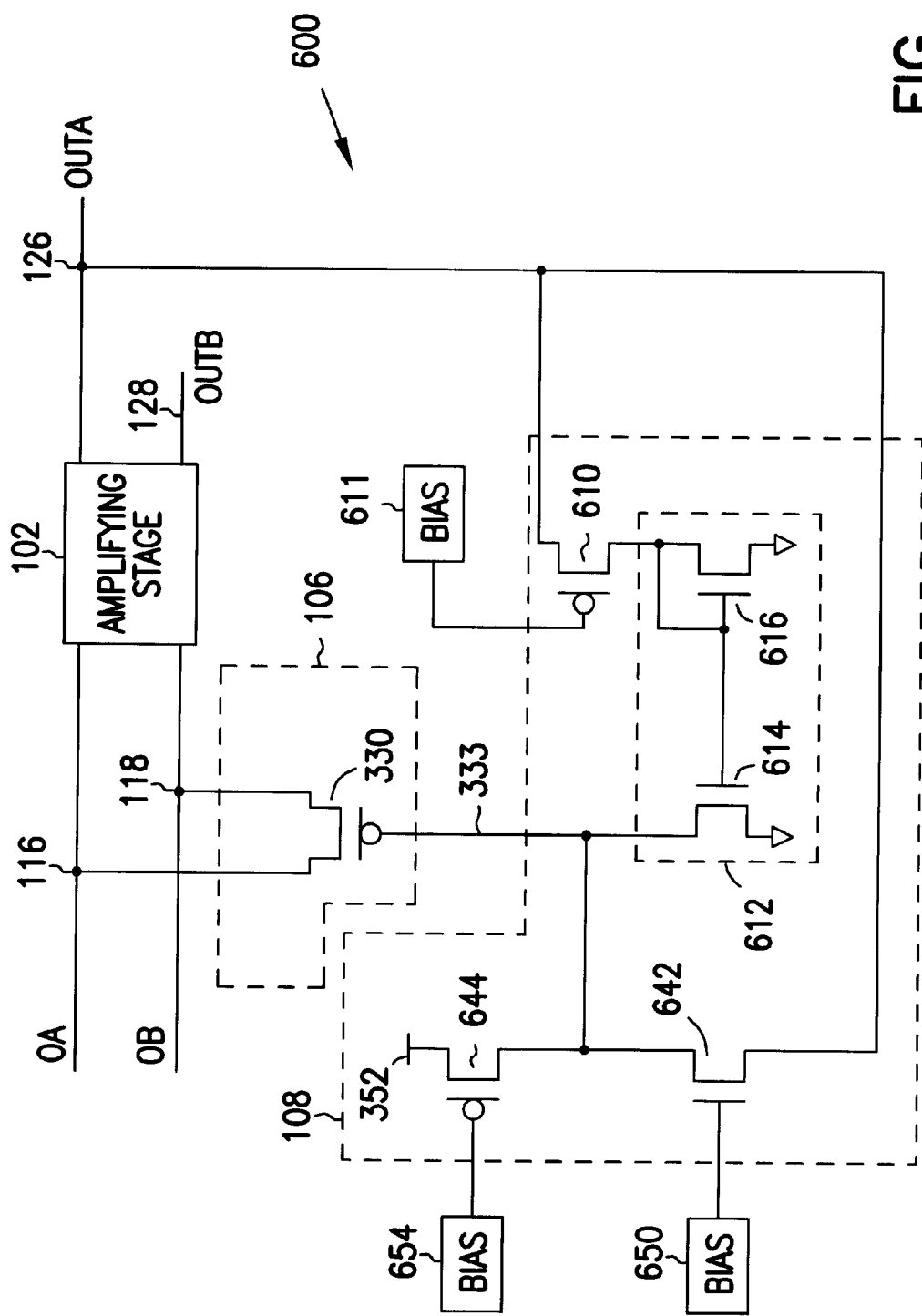

FIG. 6 shows an amplifying circuit according to another embodiment of the invention. In circuit 600, swing detect unit 108 connects to one of the nodes 126 and 128. Clamp unit 106 is similar to that of circuit 300 (FIG. 3). Swing detect unit 108 include transistors 610, 642 and 644, and a current mirror 612. Transistor 642 forms a pulldown device. Transistor 644 forms a pullup device. Transistor 610 connects to a bias unit 611. Transistors 642 and 644 connect to bias units 650 and 654. Current mirror 612 has transistors 614 and 616.

Transistor 610 and current mirror 612 detect the high signal level of the OUTA signal. Transistor 642 detects the low signal level of the OUTA signal. The low and high signal levels of the OUTA signal correspond to the signal levels of the OUTA and OUTB signals when they have a full swing.

When the signal level of the OUTA signal is low, transistor 642 turns on and pulls the voltage level of node 333 low, causing transistor 330 to turn on to limit the swing of the OA and OB signals. When the signal level of the OUTA signal is high, transistor 610 turns on, causing transistor 614 and transistor 616 to turn on and pull the voltage level of node 333 low, causing transistor 330 to turn on to limit the swing of the OA and OB signals.

When the OUTA and OUTB signals do not have a full swing, the signal level of the OUTA signal is neither low nor high. In this case, both transistors 610 and 642 turn off. Transistor 644 connects node 333 to the high voltage level of node 352. This turns off transistor 330, releasing node 116 and 118 from the clamp.

Figure 7A:
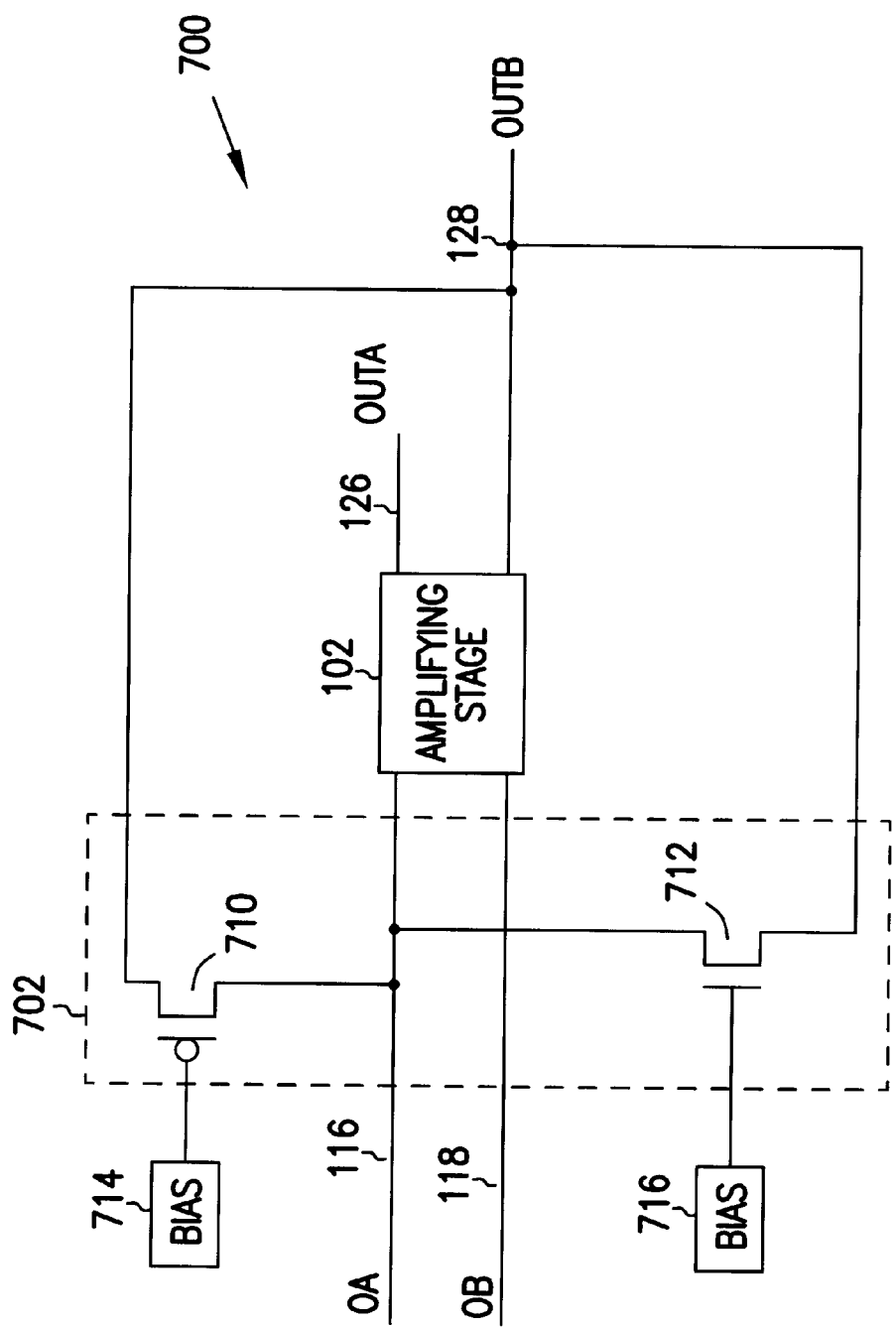

FIG. 7A shows an amplifying circuit according to another embodiment of the invention. Circuit 700 includes a swing detect and clamp unit 702 having transistors 710 and 712. These transistors form a switching network. Swing detect and clamp unit 762 detects the signal level of one of nodes 126 and 128 and clamps the differential signal levels of nodes 116 and 118.

Transistor 710 connects between nodes 116 and 128 and is controlled by a bias unit 714. Transistor 712 connects between nodes 116 and 128 and is controlled by a separate bias unit 716. Transistor 710 detects the high signal level of the OUTB signal. Transistor 712 detects the low signal level of the OUTB signal. The low and high signal levels of the OUTA signal correspond to the signal levels of the OUTA and OUTB signals when they have a full swing.

When the signal level of the OUTB signal is low, transistor 712 turns on, pulling the signal level the OA signal on node 116 lower. This reduces the difference between the signal levels of the OA and OB signals, thereby increasing the speed of the next swing of the OA and OB signals. Consequently, the speed of the swing of the OUTB signal also increases, leading to an increase in the speed of the circuit 700.

When the signal level of the OUTB signal is high, transistor 710 turns on, pulling the signal level of the OA signal on node 116 higher. This reduces the difference between the signal levels of the OA and OB signals, and consequently increases the speed of the circuit 700. When the OUTA and OUTB signals do not have a full swing, the signal level of the OUTA signal is neither low or high. In this case, both transistors 710 and 712 are off, releasing node 116 from the clamp.

Figure 7B:
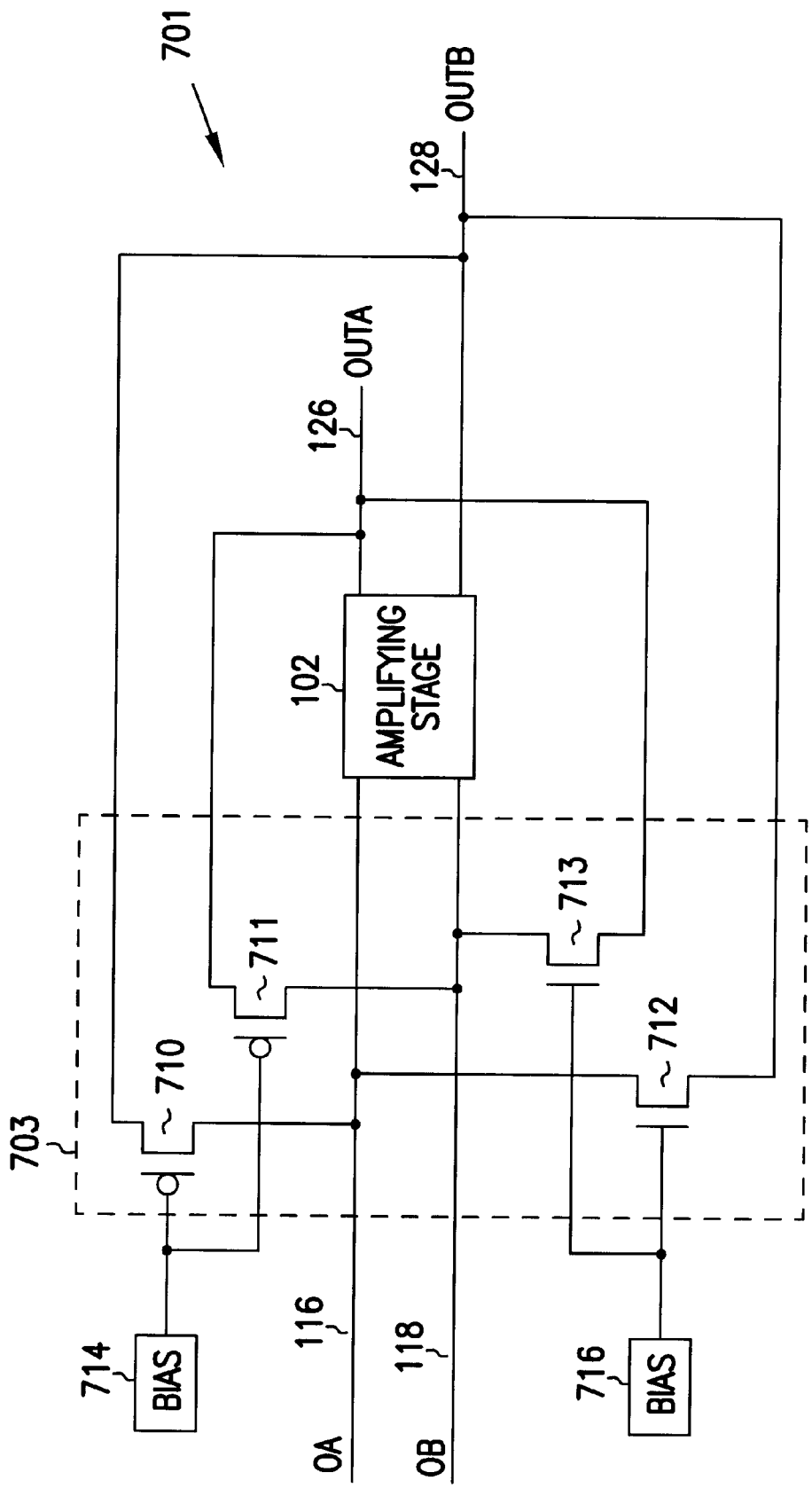

FIG. 7B shows an amplifying circuit according to another embodiment of the invention. Circuit 701 includes a swing detect and clamp unit 703 having transistors 710, 711, 712, and 713. These transistors form a switching network. Swing detect and clamp unit 703 detects the signal levels of nodes 126 and 128 and clamps signal levels of nodes 116 and 118.

Transistors 710 and 712 respond similarly as described in circuit 700. Transistor 711 connects between nodes 118 and 126 and is controlled by a bias unit 714. Transistor 713 connects between nodes 118 and 126 and is controlled by bias unit 716. Transistor 711 detects the high signal level of the OUTA signal. Transistor 713 detects the low signal level of the OUTA signal.

When the signal level of the OUTA signal is low, transistor 713 turns on, pulling the signal level of the OB signal on node 118 lower. This reduces the difference between the signal levels of the OA and OB signals, thereby increasing the speed of the next swing of the OA and OB signals. Consequently, the speed of the swing of the OUTA signal also increases, leading to an increase in the speed of the circuit 700.

When the signal level of the OUTA signal is high, transistor 711 turns on, pulling the signal level of the OB signal on node 118 lower. This reduces the difference between the signal levels of the OA and OB signals, and consequently increases the speed of the circuit 700. When the OUTA and OUTB signals do not have a full swing, the signal level of the OUTA and OUTB signals is neither low nor high. In this case, all transistors 710, 711, 712, and 713 are off, releasing nodes 116 and 118 from the clamp.

Figure 8:
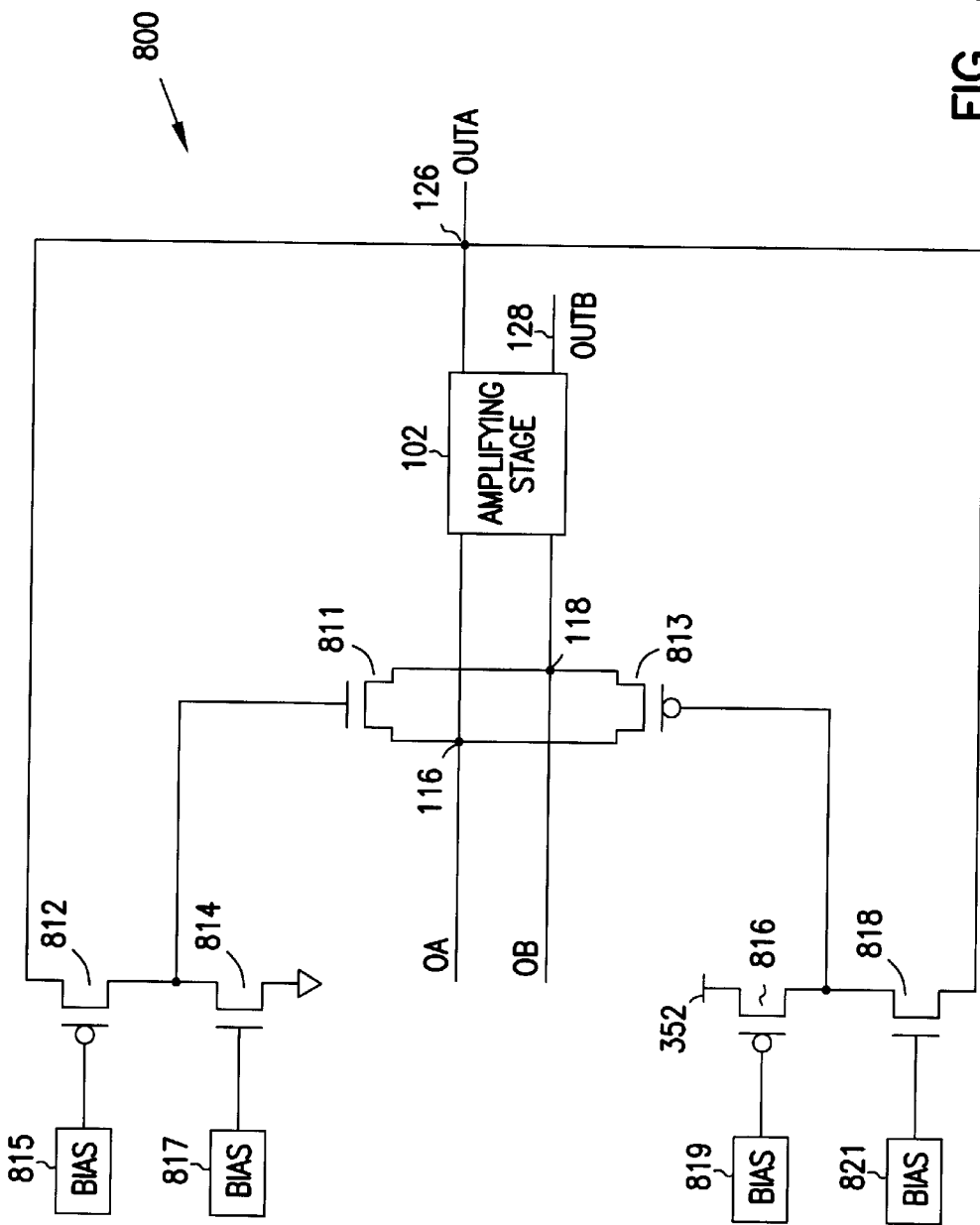

FIG. 8 shows an amplifying circuit according to another embodiment of the invention. In circuit 800, transistors 811 and 813 form a clamp unit. Transistors 812, 814, 816, and 818 form a swing detect unit; these transistors are controlled by bias units 815, 817, 819, and 821. Transistors 812 and 818 detect the low and high signal levels of one of the nodes 126 and 128 to allow transistors 811 and 813 to clamp the signal level of the nodes 116 and 118. The low and high signal levels of the OUTA signal correspond to the signal levels of the OUTA and OUTB signals when they have a full swing.

When the signal level of the OUTA signal is low, transistor 812 turns off and transistor 818 turns on, causing transistor 813 to turn on to clamp nodes 116 and 118 to clamp the signal levels of the OA and OB signals. When the signal level of the OUTA signal is high, transistor 818 turns off and transistor 812 turns on, causing transistor 811 to turn on to clamp nodes 116 and 118 to limit the signal levels of the OA and OB signals. In either case, the signal levels of the OA and OB signals are limited, leading to an increase in the speed of circuit 800.

When the OUTA and OUTB signals do not have a full swing, the signal level of the OUTA signal is neither low nor high. In this case, both transistors 812 and 818 turn off. Transistor 814 connects the gate of transistor 811 to ground, turning off transistor 811. Transistor 816 connects the gate of transistor 813 to the high voltage level of node 352, turning off transistor 813. When transistors 811 and 813 turn off, nodes 116 and 118 are released from the clamp.

Figure 9:
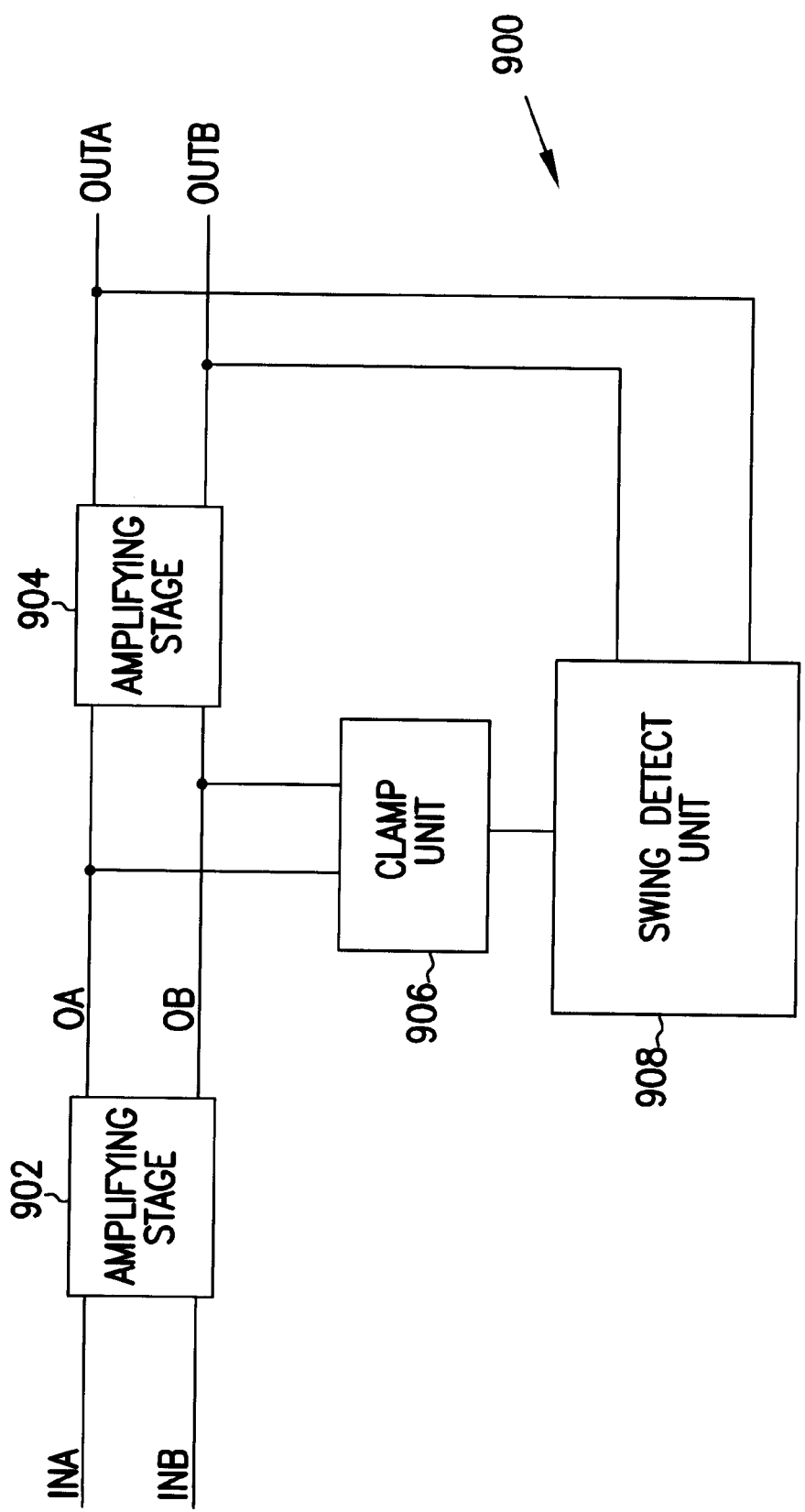

FIG. 9 shows an amplifying circuit according to another embodiment of the invention. Circuit 900 includes a first amplifying stage 902 connected to a second amplifying stage 904. Amplifying stage 902 receives input signals INA and INB and generates output signals OA and OB. Amplifying stage 904 receives the OA and OB signals and generates output signals OUTA and OUTB. A swing detect unit 908 connects to amplifying stage 904 for detecting signal levels of the OUTA and OUTB signals. A clamp unit 906 connects to swing detect unit 908 and amplifying stages 902 and 904 for limiting signal levels of the OA and OB signals based on the signal levels of the OUTA and OUTB signals. Clamp unit 906 and swing detect unit 908 can be substituted by any one of the clamp units and swing detect units described in this specification.

Figure 10:
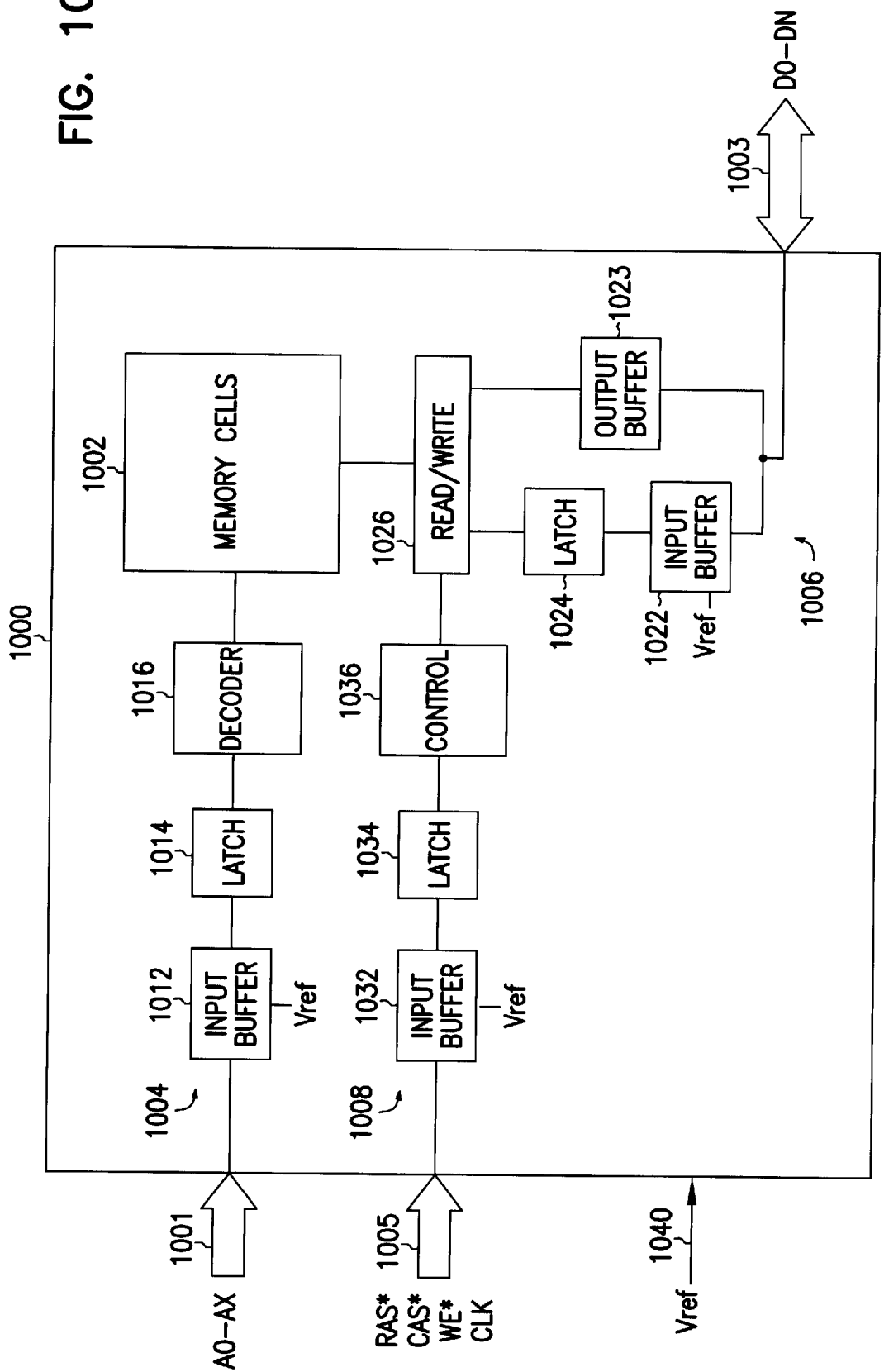
FIG. 10 shows a memory device according to an embodiment of the invention.

FIG. 10 shows a memory device according to an embodiment of the invention. Memory 1000 includes a plurality of address lines 1001 for receiving a plurality of address signals A0–AX, a plurality of data lines 1003 for transferring a plurality of data signals D0–DN, and a plurality of control lines 1005 for receiving a plurality of control signals. An example of the control signals include row access strobe (RAS*), column access strobe (CAS*), write enable (WE*), and clock (CLK). In some embodiments, the address, data, and control lines 1001, 1003, and 1005 represent external pins of memory device 1000.

Memory device 1000 further includes a plurality of memory cells 1002 for storing data. Memory cells 1002 connect to an address path 1004, a data path 1006, and a control path 1008. Address path 1004 includes an input buffer 1012, a latch 1014, and a decoder 1016. Data path 1006 includes an input buffer 1022, a latch 1024, an output buffer 1023, and a data read/write circuit 1026. Control path 1008 includes an input buffer 1032, a latch 1034, and a control circuit 1036. Address path 1004 connects to address lines 1001 to operate on one of the address signals A0–AX. Data path 1006 connects to data lines 1003 to operate on one of the data signals D0–DN. Control path 1008 connects to control lines 1005 to operate on one of the control signals RAS*, CAS*, WE*, and CLK.

Memory device 1000 further includes other address paths, data paths, and control paths that are similar to address path 1004, data path 1006, and control path 1008. The other address, data, and control paths also connect to address, data, and control lines 1001, 1003, and 1005 in similar fashions as address path 1004, data path 1006, and control path 1008. However, for simplicity, FIG. 10 only shows one of each of the address, data, and control paths.

Memory device 1000 further includes a reference line 1040 to provide a reference signal Vref. In some embodiments, the Vref signal is provided to line 1040 by a circuit or a device that is external to memory device 1000. In other embodiments, the Vref signal is provided to line 1040 by an internal circuit of memory device 1000. In embodiments represented by FIG. 10, the input buffer from each of the address, data, and control paths connects to line 1040 to receive the Vref signal.

Input buffers 1012, 1022, and 1032 can include any one of the amplifying circuits in this specification. When one of the amplifying circuits is used as one of the input buffers, output nodes 316 and 318 of the amplifying circuit (FIG. 3 or others) represent reference line 1040 and one of the address, data, or control lines. For example, when amplifying circuit 900 is used as input buffer 1012, signal INA represents one of the address lines 1001, and signal INB represents reference line 1040. In this case, the INA signal of amplifying circuit 900 represents one of the address signals A0–AX, and the INB signal of amplifying circuit 900 represents the Vref signal.

Each of the input buffers on the address, data, and control path receives the Vref signal and a corresponding signal from the address, data, and control paths. The input buffers operate on the address, data, and control signals and the Vref signal to provide latches 1014, 1024, and 1034 signals representing logic levels of the address, data, and control signals. Based on the signals at the latches, the address, data, and control paths perform appropriate functions to access memory cells 1002. Since the input buffers in memory device 1000 can include any one of the amplifying circuits of the specification in the input buffer paths, the speed of these paths are improved. Thus, the overall operation of memory device 1000 is improved.

The overall operation of memory device 1000 is similar to the operation of a typical memory device. Therefore, the operation of memory device 1000 is not described in detail in the specification. Decode circuit 1016 decodes the logic levels of the address signals A0–AX at latch 1014 to identify a location of a selected memory cell, so that data can be read from or written into the selected memory cell. In some embodiments, decode circuit 1016 includes a row decoder and a column decoder to decode a row address and a column address of the memory cell. Control circuit 1036 decodes the logic levels of the control signals RAS*, CAS*, and WE* at latch 1034 to determine whether a read or a write operation will be performed. Read/write circuit 1026 reads data from a selected memory cell during a read operation, and writes data into a selected memory cell represented by the D0–DN signals at latch 1024 during a write operation.

Memory device 1000 can be a dynamic random access memory (DRAM) or other types of memory circuits such as SRAM (Static Random Access Memory) or Flash memories. Furthermore, the DRAM could be a synchronous DRAM commonly referred to as SDRAM (Synchronous Dynamic Random Access Memory), DDR SDRAM (Double Data Rate SDRAM), DDRII SDRAM, or SGRAM (Synchronous Graphics Random Access Memory), and RLDRAM (Reduced Latency DRAM), RLDRAMII, or Rambus DRAMs. Those of ordinary skill in the art will recognize that memory device 1000 is simplified to illustrate a memory device according to an embodiment of the present invention. Therefore, memory device 1000 is not intended to be a detailed description of all of the features of a memory device.

Figure 11:
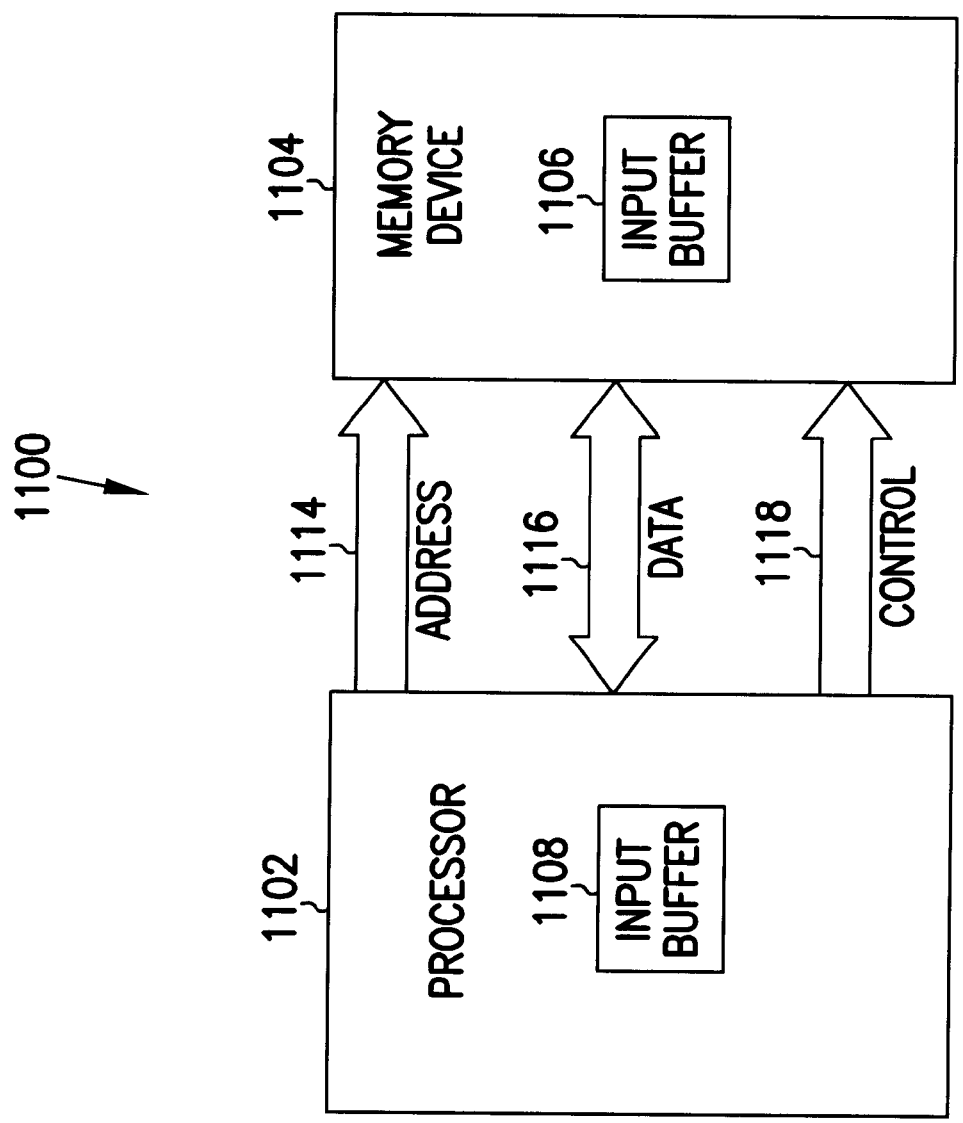
FIG. 11 shows a system according to an embodiment of the invention.

FIG. 11 shows a system according to an embodiment of the invention. System 1100 includes a first integrated circuit (IC) 1102 and a second IC 1104. ICs 1102 and 1104 can include processors, controllers, memory devices, application specific integrated circuits, and other types of integrated circuits. In embodiments represented by FIG. 11, for example, IC 1102 is represented by a processor, and IC 1104 is represented by a memory device. Processor 1102 and memory device 1104 communicate using address signals on lines 1114, data signals on lines 1116, and control signals on lines 1118.

Memory device 1104 can also be memory device 1000 of FIG. 10. Therefore, memory device 1104 includes many circuit elements, and address, data, and control paths such as address, data, and control paths 1004, 1006, and 1008 of memory device 1000. As shown in FIG. 11, memory device 1104 includes at least one input buffer in each of the address, data, and control paths. For simplicity, memory device 1104 shows only one input buffer 1106. In addition, processor 1102 also includes an input buffer 1108 to receive differential signals such as the INA and INB signals described in the specification. Input buffer 1106 or 1108 can include any one of the amplifying circuits in this specification. The operation of memory device 1104 is similar to the operation of memory device 1000.

System 1100 represented by FIG. 11 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention describe circuits and methods for variably limiting signal levels of input signals of an amplifying circuit based on signal levels of output signals of the amplifying circuit to improve the speed of the amplifying circuit. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A circuit comprising:
    an amplifying stage for receiving input signals to generate output signals;
    a swing detect unit connected to the amplifying stage for detecting signal levels of the output signals; and
    a clamp unit connected to the swing detect unit for limiting signal levels of the input signals based on a detection by the swing detect unit.

2. The circuit of claim 1, wherein the swing detect unit includes:
    a switching network connected to the amplifying stage and the clamp unit to connect a first voltage to a clamp node controlling the clamp unit based on a first set of signal levels of the output signals; and
    a pullup device for connecting a second voltage to the clamp node based on a second set of signal levels of the output signals.

3. The circuit of claim 1, wherein the clamp unit includes a switch connected to the amplifying stage for reducing a difference between signal levels of the input signals when the output signals reach a first signal level and a second signal level.

4. The circuit of claim 1, wherein the swing detect unit includes:
    a current mirror connected to a clamp node controlling the clamp unit based on a first signal level of a first output signal of the output signals;
    a pulldown device for connecting the first voltage to the clamp node based on a second signal level of the second output signal; and
    a pullup device connected to the clamp node for connecting a second voltage to the clamp node.

5. The circuit of claim 1 further comprising a second amplifying stage connected to the amplifying stage for providing the input signals.

6. A circuit comprising:
    an amplifying stage receiving input signals to generate output signals;
    a swing detect unit connected to the amplifying stage for detecting signal levels of the output signals; and
    a clamp unit connected to the swing detect unit for clamping signal levels of the input signals when the output signals reach a first signal level and a second level signal.

7. The circuit of claim 6, wherein the swing detect unit includes:
    a pair of transistors connected to the amplifying stage and the clamp unit to connect a first voltage to a clamp node controlling the clamp unit based on a first set of signal levels of the output signals; and
    a third transistor for connecting a second voltage to the clamp node based on a second set of signal levels of the output signals.

8. The circuit of claim 7, wherein the clamp unit includes a transistor having:
    a source connected to a first input node of the amplifying stage;
    a drain connected to a second input node of the amplifying stage; and
    a gate connected to the swing detect unit.

9. The circuit of claim 6, wherein the swing detect unit includes:
    a first transistor connected between the clamp unit and a first output node of the amplifying stage;
    a second transistor connected between the clamp unit and the first output node of the amplifying stage; and
    a current mirror connected to the clamp unit and the second transistor.

10. The circuit of claim 6 further comprising a second amplifying stage connected to the amplifying stage for providing the input signals.

11. A circuit comprising:
    an amplifying stage for receiving differential input signals to generate differential output signals; and
    a swing detect unit connected to the amplifying stage for detecting signal levels of the differential output signals; and
    a clamp unit connected to the swing detect unit for limiting signal levels of the differential input signals based on signal levels of the differential output signals.

12. The circuit of claim 11, wherein the swing detect unit includes a switching network connected to the amplifying stage for reducing a difference in signal levels of the differential input signals when the signal levels of the differential output signals reach a first signal level and a second level signal.

13. The circuit of claim 11 further comprising a second amplifying stage connected to the amplifying stage for providing the differential input signals.

14. A memory device comprising:
    a plurality of memory cells; and
    an address path, a data path, and a control path, all paths connected to the memory cells, wherein at least one of the paths includes an input buffer, the input buffer including:
        an amplifying stage for receiving input signals to generate output signals;
        a swing detect unit connected to the amplifying stage for detecting signal levels of the output signals; and
        a clamp unit connected to the swing detect unit for limiting signal levels of the input signals based on a detection by the swing detect unit.

15. The memory device of claim 14, wherein the swing detect unit includes:
    a switching network connected to the amplifying stage and the clamp unit to connect a first voltage to a clamp node controlling the clamp unit based on a first set of signal levels of the output signals; and
    a pullup device for connecting a second voltage to the clamp node based on a second set of signal levels of the output signals.

16. The memory device of claim 14, wherein the clamp unit includes a switch connected to the amplifying stage for reducing a difference between signal levels of the input signals when the output signals reach a first signal level and a second signal level.

17. The memory device of claim 14, wherein the swing detect unit includes:
    a current mirror connected to a clamp node controlling the clamp unit based on a first signal level of a first output signal of the output signals;

a pulldown device for connecting the first voltage to the clamp node based on a second signal level of the second output signal; and a pullup device connected to the clamp node for connecting a second voltage to the clamp node.

18. The memory device of claim 14, further comprising a second amplifying stage connected to the amplifying stage for providing the input signals.

19. A memory device comprising:

a plurality of memory cells; and an address path, a data path, and a control path, all paths connected to the memory cells, wherein at least one of the paths includes an input buffer, the input buffer including:

an amplifying stage for receiving differential input signals to generate differential output signals; and a swing detect unit connected to the amplifying stage for detecting signal levels of the differential output signals; and a clamp unit connected to the swing detect unit for limiting signal levels of the differential input signals based on signal levels of the differential output signals.

20. The memory device of claim 19, wherein the swing detect unit includes a switching network connected to the amplifying stage for reducing a difference in signal levels of the differential input signals when the signal levels of the differential output signals reach a first signal level and a second level signal.

21. A system comprising:

a processor; and a memory device connected to the processor, the memory device including:

a plurality of memory cells; and an address path, a data path, and a control path, all paths connected to the memory cells, wherein at least one of the paths includes an input buffer, the input buffer including:

an amplifying stage for receiving input signals to generate output signals;

a swing detect unit connected to the amplifying stage for detecting signal levels of the output signals; and a clamp unit connected to the swing detect unit for limiting signal levels of the input signals based on a detection by the swing detect unit.

22. The system of claim 21, wherein the swing detect unit includes:

a switching network connected to the amplifying stage and the clamp unit to connect a first voltage to a clamp node controlling the clamp unit based on a first set of signal levels of the output signals; and a pullup device for connecting a second voltage to the clamp node based on a second set of signal levels of the output signals.

23. The system of claim 21, wherein the clamp unit includes a switch connected to the amplifying stage for reducing a difference between signal levels of the input signals when the output signals reach a first signal level and a second signal level.

24. The system of claim 21, wherein the swing detect unit includes:

a current mirror connected to a clamp node controlling the clamp unit based on a first signal level of a first output signal of the output signals;

a pulldown device for connecting the first voltage to the clamp node based on a second signal level of the second output signal; and a pullup device connected to the clamp node for connecting a second voltage to the clamp node.

25. The system of claim 21 further comprising a second amplifying stage connected to the amplifying stage for providing the input signals.

26. A system comprising:

a processor; and a memory device connected to the processor, the memory device including:

a plurality of memory cells; and an address path, a data path, and a control path, all paths connected to the memory cells, wherein at least one of the paths includes an input buffer, the input buffer including:

an amplifying stage for receiving differential input signals to generate differential output signals; and a swing detect unit connected to the amplifying stage for detecting signal levels of the output signals; and a clamp unit connected to the swing detect unit for limiting signal levels of the differential input signals based on signal levels of the differential output signals.

27. The system of claim 26, wherein the swing detect unit includes a switching network connected to the amplifying stage for reducing a difference in signal levels of the differential input signals when the signal levels of the differential output signals reach a first signal level and a second level signal.

28. A method comprising:

receiving input signals;

generating output signals based on the input signals;

detecting signal levels of the output signals using a swing detect unit; and limiting the signal levels of the input signals based on the detecting signal levels of the output signals, wherein limiting is performed by a clamp unit.

29. The method of claim 28, wherein detecting signal levels includes detecting when one of the output signals reaches a first signal level.

30. The method of claim 29, wherein detecting signal levels includes detecting when another one of the output signals reaches a second signal level unequaled to the first signal level.

31. The method of claim 28, wherein detecting signal levels includes detecting a first signal level and a second signal level within a range, wherein the first signal level is the lowest signal level of the range and the second signal level is the highest signal level of the range.

32. The method of claim 28, wherein detecting signal levels includes detecting when the output signals reach a full swing.

33. The method of claim 28, wherein limiting the signal levels of the input signals includes reducing a difference in signal levels of the input signals.

34. A method comprising:

receiving differential input signals;

generating differential output signals based on the differential input signals;

detecting signal levels of the differential output signals using a swing detect unit; and clamping signal levels of the differential input signals when the differential output signals reach a first signal and a second signal level, wherein clamping is performed by a clamp unit.

35. The method of claim 34, wherein clamping signal levels includes clamping the differential input signals when the output signals reach a lowest signal level and a highest signal level of a range of signal levels of the differential output signals.

36. The method of claim 34, wherein detecting signal levels includes detecting when the differential output signals reach a full swing.

37. The method of claim 34, wherein limiting the signal levels of the differential input signals includes reducing a difference in signal levels of the differential input signals.

38. A memory device comprising:

a plurality of memory cells; and an address path, a data path, and a control path, all paths connected to the memory cells, wherein at least one of the paths includes an input buffer, the input buffer including:

an amplifying stage receiving input signals to generate output signals;

a swing detect unit connected to the amplifying stage for detecting signal levels of the output signals; and a clamp unit connected to the swing detect unit for clamping signal levels of the input signals when the output signals reach a first signal level and a second level signal.

39. The memory device of claim 38, wherein the swing detect unit includes:

a pair of transistors connected to the amplifying stage and the clamp unit to connect a first voltage to a clamp node controlling the clamp unit based on a first set of signal levels of the output signals; and a third transistor for connecting a second voltage to the clamp node based on a second set of signal levels of the output signals.

40. The memory device of claim 38, wherein the clamp unit includes a transistor having:

a source connected to a first input node of the amplifying stage;

a drain connected to a second input node of the amplifying stage; and a gate connected to the swing detect unit.

41. The memory device of claim 38 further comprising a second amplifying stage connected to the amplifying stage for providing the input signals.

* * * * *

UNITED STATES PATENT AND TRADEMARK OFFICE
CERTIFICATE OF CORRECTION

PATENT NO. : 6,731,150 B2
DATED : May 4, 2004
INVENTOR(S) : Huber

It is certified that error appears in the above-identified patent and that said Letters Patent is hereby corrected as shown below:

Column 2,
Line 61, after "T5" insert -- , --.

Column 5,
Line 14, delete "include" and insert -- includes --, therefor.
Line 43, delete "762" and insert -- 702 --, therefor.

Column 12,
Line 18, after "the" insert -- differential --.

Signed and Sealed this

Thirteenth Day of July, 2004

JON W. DUDAS
*Acting Director of the United States Patent and Trademark Office*